US008250920B2

(12) United States Patent
Yamanaka et al.

(10) Patent No.: US 8,250,920 B2
(45) Date of Patent: Aug. 28, 2012

(54) INERTIAL SENSOR

(75) Inventors: Kiyoko Yamanaka, Tachikawa (JP); Hideaki Takano, Kokubunji (JP)

(73) Assignee: Hitachi, Ltd, Tokyo (JP)

( * ) Notice: Subject to any disclaimer, the term of this patent is extended or adjusted under 35 U.S.C. 154(b) by 698 days.

(21) Appl. No.: 12/342,137

(22) Filed: Dec. 23, 2008

(65) Prior Publication Data
US 2009/0183568 A1    Jul. 23, 2009

(30) Foreign Application Priority Data
Jan. 21, 2008 (JP) .................. 2008-010388

(51) Int. Cl.
G01C 23/00 (2006.01)
G01C 19/56 (2012.01)

(52) U.S. Cl. ...................... 73/510; 73/504.12
(58) Field of Classification Search .......... 73/510, 73/504.04, 504.12, 514.32
See application file for complete search history.

(56) References Cited

U.S. PATENT DOCUMENTS

| | | | |
|---|---|---|---|
| 6,631,643 B2 * | 10/2003 | Malvern et al. ............ | 73/514.32 |
| 6,845,666 B2 * | 1/2005 | Mochida ................... | 73/504.12 |
| 7,004,025 B2 * | 2/2006 | Tamura ........................ | 73/511 |
| 7,047,808 B2 * | 5/2006 | Malvern et al. ............. | 73/514.12 |
| 7,290,449 B2 * | 11/2007 | Ao .................................. | 73/510 |
| 2004/0149035 A1 | 8/2004 | Acar et al. | |

FOREIGN PATENT DOCUMENTS

| | | |
|---|---|---|
| EP | 1167979 A2 | 1/2002 |
| JP | 10-010148 A | 1/1998 |
| JP | 10-239064 A | 9/1998 |
| JP | 2000-028365 A | 1/2000 |
| JP | 2002-005950 A | 1/2002 |
| JP | 2005-283424 A | 10/2005 |
| WO | WO 2004/076340 A1 | 9/2004 |

OTHER PUBLICATIONS

Hudson et al., "High-performance microfabricated angular rate sensor," *Journal of Microlithography, Microfabrication, and Microsystems*, Oct.-Dec. 2005, 4(4): pp. 043006-1-043006-8.
Extended European Search Report and Search Opinion issued Jan. 11, 2012, in European Patent Application No. 08022419.

* cited by examiner

*Primary Examiner* — John Chapman, Jr.
(74) *Attorney, Agent, or Firm* — Miles & Stockbridge P.C.

(57) ABSTRACT

An angular rate sensor and an acceleration sensor are sealed at the same sealing pressure. The sealing pressure at this time is put into a reduced pressure state below the atmospheric pressure in view of improving a detection sensitivity of the angular rate sensor. Even in the reduced pressure atmosphere, to improve the detection sensitivity of the acceleration sensor, a shift suppressing portion (damper) for suppressing shifts of a movable body of the acceleration sensor is provided. This shift suppressing portion includes a plurality of protruding portions integrally formed with the movable body and a plurality of protruding portions integrally formed with a peripheral portion, and the protruding portions are alternately disposed separately at equal intervals.

17 Claims, 8 Drawing Sheets

INERTIAL SENSOR

CROSS-REFERENCE TO RELATED APPLICATION

The present application claims priority from Japanese Patent Application No. JP 2008-010388 filed on Jan. 21, 2008, the content of which is hereby incorporated by reference into this application.

TECHNICAL FIELD OF THE INVENTION

The present invention relates to an inertial sensor, particularly, it relates to a technique effectively applied to an inertial sensor provided with an angular rate sensor and an acceleration sensor.

BACKGROUND OF THE INVENTION

Japanese Patent Application Laid-Open Publication No. 2002-005950 (Patent Document 1) discloses a technique that aims to improve detection sensitivity by both of an angular rate sensor and an acceleration sensor. Specifically, a planar vibrating body of the angular rate sensor and a movable body of the acceleration sensor are disposed on the same substrate in a floating state interposing a space between them. Then, a lid member is formed above the planar vibrating body and the movable body. A space portion configured by a substrate and the lid member is divided into a space portion for angular rate sensor and a space portion for acceleration sensor by a dividing wall portion. The space portion for the angular rate sensor is in a vacuum state and in an airtightly sealed state, and the space portion for the acceleration sensor is in an airtightly sealed state at the atmospheric pressure. With such a configuration, the planer vibrating body can vibrate in high frequency and large amplitude, so that the angular rate detection sensitivity of the angular rate sensor can be enhanced. On the other hand, since the movable body does not vibrate in high frequency and large amplitude by the damping of air even when the vibration of the planar vibrating body is propagated, the acceleration detection sensitivity of the acceleration sensor can be enhanced.

SUMMARY OF THE INVENTION

The sensors having a movable structure include various types, and for example, as a widely known inertial sensor, an acceleration sensor and an angular rate sensor (vibration gyro) are available. Among them, the inertial sensor adapting an electrostatic capacitance change for a detection system has advantages of having little fluctuation of the characteristics in a wide temperature range including a room temperature as compared with a detection system using a piezoelectric body and a detection system using a distortion resistance bridge. Hence, the inertial sensor of an electrostatic capacitance detection system is often used for the vehicle application in which the usage temperature of the sensor covers a wide range depending on to the environment.

From among the sensors for the vehicle application, when a sensor is used particularly for the running control of a vehicle, the acceleration sensor is used for detecting an inclination and a right-and-left motion state of the vehicle, and, the angular rate sensor is used for detecting a rotation speed (yaw rate) in the traveling direction of a vehicle body. Taking into consideration the case where the sensors of two kinds or more are used in this manner, an inertial sensor is proposed, in which the angular rate sensor and the acceleration sensor are provided by an integrated package. It is conceivable that this angular rate sensor and the acceleration sensor are airtightly sealed with at same pressure.

The angular rate sensor includes a vibrating body and a Coriolis frame provided in the interior of the vibrating body, and when an angular rate is applied at the time when this vibrating body is driven and vibrated with a certain frequency, a Coriolis force is generated, and a Coriolis frame provided in the interior of the vibrating body is displaced in a direction orthogonal to the vibration direction of the vibrating body. By detecting the amount of displacement by this Coriolis force of the Coriolis frame, the angular rate can be detected. At this time, the faster the speed of the driving and vibration of the vibrating body is, the larger the Coriolis force becomes. Hence, to improve the detection sensitivity of the angular rate sensor, it is necessary to vibrate the vibrating body of the angular rate sensor in high frequency and large amplitude.

However, a fine vibrating body formed by a micromachining technique is greatly affected by damping of the air. Since the damping is a force generated proportional to the speed of the vibrating body, under a high pressure, when an attempt is made to vibrate the vibrating body in a state where the speed is fast, that is, in a state having high frequency and large amplitude, a damping effect due to air becomes extremely large, and it is no longer possible to vibrate the vibrating body in a state with high frequency and large amplitude. As a result, the detection sensitivity of the angular rate sensor is significantly deteriorated.

Hence, it is conceivable that the angular rate sensor and the acceleration sensor are airtightly sealed by a low pressure. By airtightly sealing the angular rate sensor in a low pressure state in this manner, an effect of the damping given to the vibrating body can be reduced. Hence, the vibrating body of the angular rate sensor can be vibrated in high frequency and large amplitude, thereby improving the detection sensitivity of the angular rate.

However, when not only the angular rate sensor but also the acceleration sensor is disposed in a low pressure state, the movable body of the acceleration sensor is put into a state very liable to vibrate. When the acceleration sensor is not applied with acceleration, the movable body of the acceleration sensor is preferably in a stand-still state. However, when the movable body of the acceleration sensor is disposed in a low pressure state, it ends up being sensitively displaced, and therefore, even in a state where the acceleration is not applied, the movable body is displaced. In other words, the movable body of the acceleration sensor preferably does not react much sensibly in view of improving the detection sensitivity of the acceleration sensor.

Hence, the inertial sensor having the angular rate sensor and the acceleration sensor is conceivable to take a configuration as shown in Patent Document 1. That is, the vibrating body for the angular rate sensor and the movable body for the acceleration sensor are disposed on the same substrate, whereas the vibrating body for the angular rate sensor and the movable body for the acceleration sensor are disposed in the space portions respectively in different atmospheric pressures. Specifically, the vibrating body for the angular rate sensor is disposed in the space portion airtightly sealed in a low pressure state, and the movable body for the acceleration sensor is disposed in the space portion airtightly sealed in a high pressure state. With such a configuration, the vibrating body for the angular rate sensor can vibrate in high frequency and large amplitude without being affected by the damping due to air, thereby improving the detection sensitivity of the angular rate sensor. On the other hand, since the movable body for the acceleration sensor is placed under a high pressure, it receives an effect of the damping due to air, and can suppress the displacement sensitive more than necessary, and as a result, the detection sensitivity of the acceleration sensor can be improved. Consequently, according to the inertial sensor described in Patent Document 1, both of the detection sensitivity of the angular rate and the detection sensitivity of the acceleration can be improved.

However, in the inertial sensor disclosed in Patent Document 1, to improve the detection sensitivity of the angular rate sensor and the detection sensitivity of the acceleration sensor, the sealing pressures inside the disposing space of the angular rate sensor and the disposing space of the acceleration sensor are made different. Hence, to perform the pressure management of two different specifications inside the substrate (semiconductor chip), it is necessary to introduce an airtight sealing technique and a getter material which eliminates an unnecessary gas molecule into a manufacturing process. This has negative effects of bringing about a high manufacturing cost. Further, to perform the pressure management of two different specifications inside the substrate, there arises a problem that it is difficult to maintain reliability for temporal change.

An object of the present invention is to provide a technique capable of improving the detection sensitivity of the angular rate sensor and the detection sensitivity of the acceleration sensor even when the sealing pressure of the angular rate sensor and the sealing pressure of the acceleration sensor are made the same.

The above and other objects and novel characteristics of the present invention will be apparent from the description of the present specification and the accompanying drawings.

The typical ones of the inventions disclosed in the present application will be briefly described as follows.

A typical embodiment comprises: (a) an angular rate sensor which detects an angular rate; and (b) an acceleration sensor which detects acceleration, where the angular rate sensor includes: (a1) a first peripheral portion formed on a first semiconductor substrate; (a2) a first cavity portion formed in the interior of the first peripheral portion; (a3) a first fixing portion formed in the interior of the first cavity portion; (a4) a vibrating body formed in the interior of the first cavity portion; (a5) a first elastic deforming portion which is elastically deformable and connects the first fixing portion and the vibrating body; (a6) a Coriolis frame formed in the interior of the vibrating body; and (a7) a second elastic deforming portion which is elastically deformable and connects the vibrating body and the Coriolis frame.

On the other hand, the acceleration sensor includes: (b1) a second peripheral portion formed on a second semiconductor substrate; (b2) a second cavity portion formed in the interior of the second peripheral portion; (b3) a second fixing portion formed in the interior of the second cavity portion; (b4) a movable body formed in the interior of the cavity portion; and (b5) a third elastic deforming portion which is elastically deformable and connects the second fixing portion and the movable body.

Here, the first cavity portion and the second cavity portion are set at a same pressure, and the movable body of the acceleration sensor is provided with a first shift suppressing portion which suppresses shifts with respect to an acceleration.

According to the typical embodiment, even when the sealing pressure of the angular rate sensor and the sealing pressure of the acceleration sensor are made the same, since the movable body of the acceleration sensor is provided with a first shift suppressing portion for suppressing the shift to the acceleration, the improvement of the detection sensitivity of the angular rate sensor and the improvement of the detection sensitivity of the acceleration sensor can be achieved. That is, even when the sealing pressure of the angular rate sensor and the sealing pressure of the acceleration sensor are made the same, and also when the uniform sealing pressure is determined so that the detection sensitivity of the angular rate sensor is improved, the deterioration of the detection sensitivity of the acceleration sensor can be suppressed.

The effects obtained by typical aspects of the present invention will be briefly described below.

According to the typical embodiment, even when the sealing pressure of the angular rate sensor and the sealing pressure of the acceleration sensor are made the same, the improvement of the detection sensitivity of the angular rate sensor and the improvement of the detection sensitivity of the acceleration sensor can be achieved.

Further, according to the exemplary embodiment, while it is disclosed that the sealing pressure of the angular rate sensor and the sealing pressure of the acceleration sensor are reduced below the atmospheric pressure, even if the sealing pressure is an atmospheric pressure or a pressure higher than atmospheric pressure, the present invention is applicable.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Also, in some drawings used in the embodiments, hatching is used even in a plan view so as to make the drawings easy to see.

First Embodiment

Figure 1:
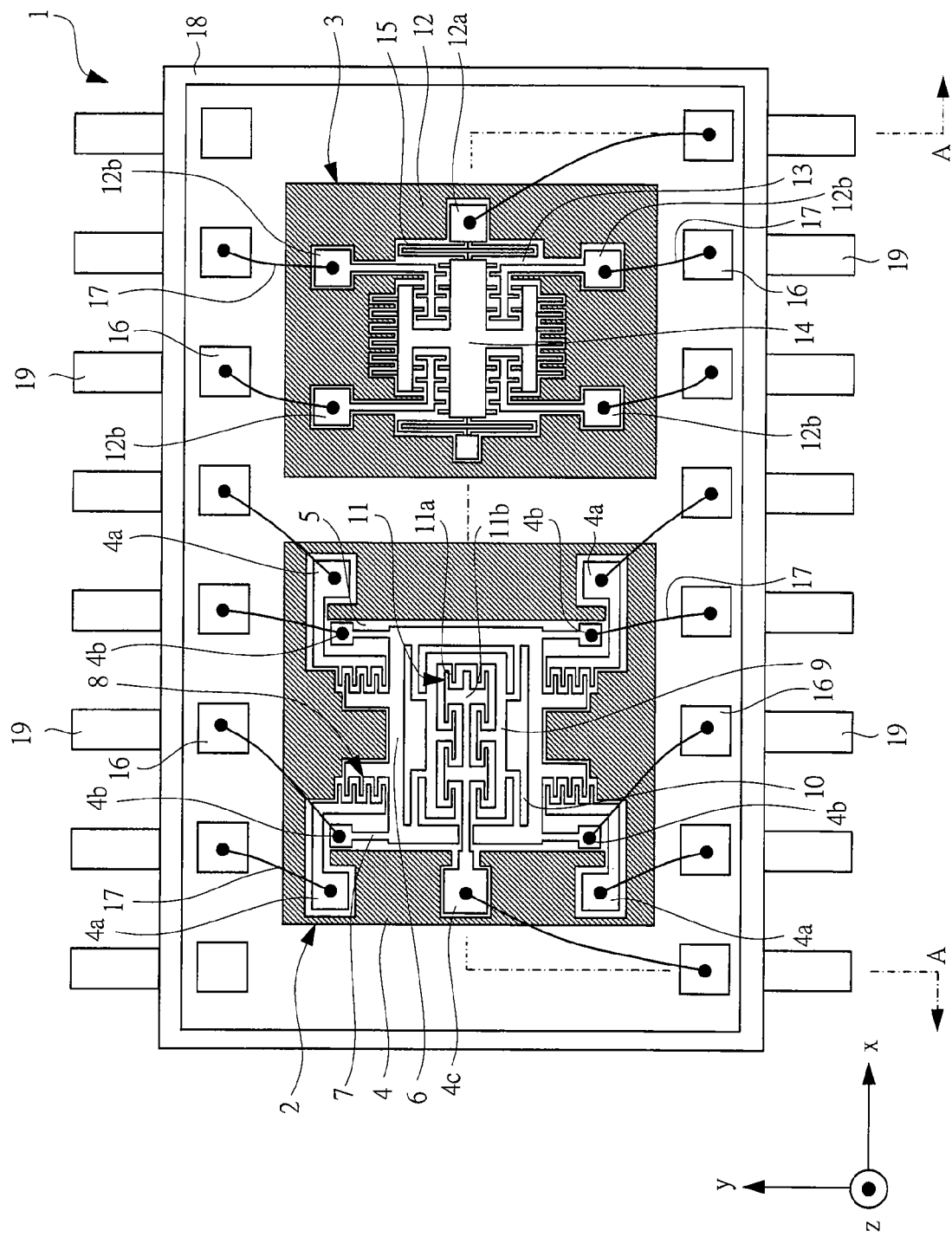
FIG. 1 is a plan view showing a configuration of an inertial sensor according to a first embodiment of the present invention.

An inertial sensor in a first embodiment will be described with reference to the drawings. FIG. 1 is a plan view showing an inertial sensor according to the first embodiment. In FIG. 1, an inertial sensor 1 includes an angular rate sensor 2 and an acceleration sensor 3. In FIG. 1, the angular rate sensor 2 and the acceleration sensor 3 are formed in separate semiconductor chips.

First, a configuration of the angular rate sensor 2 will be described. As shown in FIG. 1, the angular rate sensor 2 has a cavity portion (first cavity portion) 5 formed in the interior of a rectangular periphery portion (first periphery portion) 4. In the interior of this cavity portion 5, a fixing portion 4a, a fixing portion (first fixing portion) 4b, a fixing portion 4c, and a vibrating body 6 are formed. The vibrating body 6 is connected to the fixing portion 4b by an elastic deforming portion (first elastic deforming portion; support beam) 7. Further, between this vibrating body 6 and the fixing portion 4a, a driving portion 8 is provided, and by this driving portion 8, the vibrating body 6 can be vibrated. That is, the vibrating body 6 is configured by the driving portion 8 to vibrate in an x direction. The driving portion 8 is configured by a capacitor element formed of a fixed electrode formed to the fixing portion 4a and a movable electrode formed to the vibrating body 6, and can vibrate the vibrating body 6 by electrostatic attractive force of this capacitor element.

In the interior of the vibrating body 6, a Coriolis frame 9 is formed, and this Coriolis frame 9 is connected to the vibrating body 6 through an elastic deforming portion (second elastic deforming portion) 10. Consequently, the Coriolis frame 9 is vibrated together with the vibrating body 6 in the x direction when the vibrating body 6 vibrates. The Coriolis frame 9 is configured to be capable of being displaced in a y direction orthogonal to the x direction by the Coriolis force when the angular rate sensor 2 rotates about a z axis to generate an angular rate.

The Coriolis frame 9 is formed with a detecting portion 11 for detecting the displacement in the y direction of the Coriolis frame 9 by the Coriolis force. This detecting portion 11 is configured by a detecting electrode 11a formed to the Coriolis frame 9 and a fixed electrode 11b connected to the fixing portion 4c.

Next, a simple configuration of the acceleration sensor 3 will be described. As shown in FIG. 1, the acceleration sensor 3 has a cavity portion (second cavity portion) 13 formed in the interior of a rectangular peripheral portion (second peripheral portion) 12. In the interior of this cavity portion 13, a fixing portion (second fixing portion) 12a, a fixing portion 12b, and a movable body 14 are formed. The movable body 14 is connected to the fixing portion 12a through an elastic deforming portion (third elastic deforming portion) 15. The movable body 14 is configured to be capable of moving in the x direction. The foregoing is the simple configuration of the acceleration sensor 3. The detailed configuration of the acceleration sensor 3 and the distinctive configuration in the first embodiment will be described later.

The angular rate sensor 2 and the acceleration sensor 3 are stored in a same package 18. For example, as shown in FIG. 1, the angular rate sensor 2 and the acceleration sensor 3 are arranged in the interior of the package 18, and the angular rate sensor 2 and the acceleration sensor 3 are arranged in parallel in the x direction. The fixing portion 4a, the fixing portion 4b, the fixing portion 4c, the vibrating body 6, the elastic deforming portion 7, the driving portion 8, the Coriolis frame 9, the elastic deforming portion 10, and the detecting portion 11 of the angular rate sensor 2 are formed of conductor (semiconductor), respectively, and the fixing portion 4a, the fixing portion 4b, and the fixing portion 4c are electrically connected by a terminal 16 and a wire 17 formed in the interior of the package 18, respectively. The fixing portion 4a is electrically connected to a fixed electrode forming a part of the driving portion 8. And, the fixing portion 4b is electrically connected to: the vibrating body 6 via the elastic deforming portion 7; the Coriolis frame 9 connected to the vibrating body 6 via the elastic deforming portion 10; and the detecting portion 11a of the detecting portion 11 formed in the Coriolis frame 9. Further, the fixing portion 4c is electrically connected to the fixed electrode 11b forming a part of the detecting portion 11. The terminal 16 formed in the interior of the package 18 is electrically connected to a lead 19 pulled outside of the package 18.

Likewise, the fixing portion 12a, the fixing portion 12b, the movable body 14, and the elastic deforming portion 15 of the acceleration sensor 3 are formed of conductor (semiconductor), respectively, and the fixing portion 12a and the fixing portion 12b are electrically connected by the terminal 16 and the wire 17 formed in the interior of the package 18, respectively. The fixing portion 12a is electrically connected to the movable body 14 via the elastic deforming portion 15. The fixing portion 12b is electrically connected to a fixed electrode to be described later. Further, the terminal 16 formed in the interior of the package 18 is electrically connected to a lead 19 drawn out of the package 18.

The angular rate sensor 2 in the first embodiment is configured as described above, and the operation thereof will be described as follows. First, in FIG. 1, the vibrating body 6 is vibrated by the driving portion 8 in the x direction. At this time, the Coriolis frame 9 connected to the interior of the vibrating body 6 via the elastic deforming portion 10 is also vibrated in the x direction. In this state, a rotation having a predetermined angular rate about a z axis is generated. Then, by this rotation, the Coriolis force is generated. The vibrating body 6 and the Coriolis frame 9 vibrating in the x direction by the Coriolis force are applied with a force to displace in the y direction orthogonal to the x direction. At this time, while the vibrating body 6 vibrating in the x direction is connected to the fixing portion 4b by the elastic deforming portion 7, this elastic deforming portion 7 makes an elastic deformation in the x direction, but is unable to make an elastic deformation in the y direction. Hence, even when the Coriolis force is applied to the vibrating body 6 vibrating in the x direction, the vibration is not changed to the y direction. In contrast to this, the Coriolis frame 9 formed in the interior of the vibrating body 6 is connected to the vibrating body 6 via the elastic deforming portion 10. Since this elastic deforming portion 10 is configured to be capable of making an elastic deformation in the y direction, the Coriolis frame 9 is displaced in the y direction by the Coriolis force. This displacement in the y direction by the Coriolis frame 9 is detected by the detecting portion 11. That is, while the Coriolis frame 9 is displaced to the y direction by the Coriolis force, by this displacement, the detecting electrode 11a integrally formed with the Coriolis frame 9 is also displaced in the same manner as the Coriolis frame 9. Consequently, a distance between the detecting electrode 11a integrally formed with the Coriolis frame 9 and the fixed electrode 11b of the detecting portion 11 formed separately from the Coriolis frame 9 is changed. When the distance between the detecting electrode 11a and the fixed electrode 11b is changed, a capacitance value of the capacitor element formed by the detecting electrode 11a and the fixed electrode 11b is changed. By electrically detecting the capacitance change of this capacitor element, the Coriolis force is indirectly determined, and when the Coriolis force can be determined, the angular rate can be calculated. In this manner, the angular rate can be detected by the angular rate sensor 2.

Here, to improve the detection sensitivity of the angular rate by the angular rate sensor 2, it is necessary to make the vibrations of the vibrating body 6 and the Coriolis frame 9 in the x direction in high frequency and large amplitude. That is, when the vibrations in the x direction of the vibrating body 6 and the Coriolis frame 9 are made in high frequency and large amplitude, the displacement to the y direction of the Coriolis frame 9 by the Coriolis force becomes large. That is, when the Coriolis frame 9 receives the same Coriolis force, the displacement in the y direction of the Coriolis frame 9 becomes large as the vibration in the x direction of Coriolis frame 9 is made in higher frequency and larger amplitude. In other words, the displacement in the y direction of the Coriolis frame 9 becomes larger as the vibration of the Coriolis frame 9 in the x direction is in higher frequency and larger amplitude when the Coriolis frame 9 receives the same Coriolis force means that the distance between the detecting electrode 11a and the fixed electrode 11b which configure the detecting portion 11 is largely changed, and in this case, the change of the capacitance also becomes large. Consequently, when the vibrations of the vibrating body 6 and the Coriolis frame 9 in the x direction are made in high frequency and large amplitude, the detection sensitivity of the angular rate by the angular rate sensor 2 is improved.

To perform the vibrations of the vibrating body 6 and the Coriolis frame 9 in the x direction in high frequency and large amplitude, it is necessary to reduce the influence of the damping of air (the effect of viscous resistance of air). That is, since the damping due to air is a force generated in proportion to the speed of the vibrating body, when an attempt is made to vibrate the vibrating body in a state in which the speed is fast in the atmosphere, that is, in a state having high frequency and large amplitude, the influence of the damping due to air becomes extremely large, and even when the vibrating body is made to vibrate in a state of high frequency and large amplitude, the vibration is quickly attenuated by the influence of the damping. As a result, it becomes unable to improve the detection sensitivity of the angular rate sensor 2.

Accordingly, it is considered that the angular rate sensor 2 is airtightly sealed in a state where the pressure is reduced below the atmospheric pressure. By airtightly sealing the angular rate sensor 2 in a reduced pressure state in this manner, the influence of the damping given to the vibrating body 6 can be reduced. For this reason, it becomes possible to vibrate the vibrating body 6 of the angular rate sensor 2 in high frequency and large amplitude, thereby improving the detection sensitivity of the angular rate. A state where the angular rate sensor 2 is airtightly sealed in a reduced pressure state below the atmospheric pressure is shown in FIG. 2.

Figure 2:
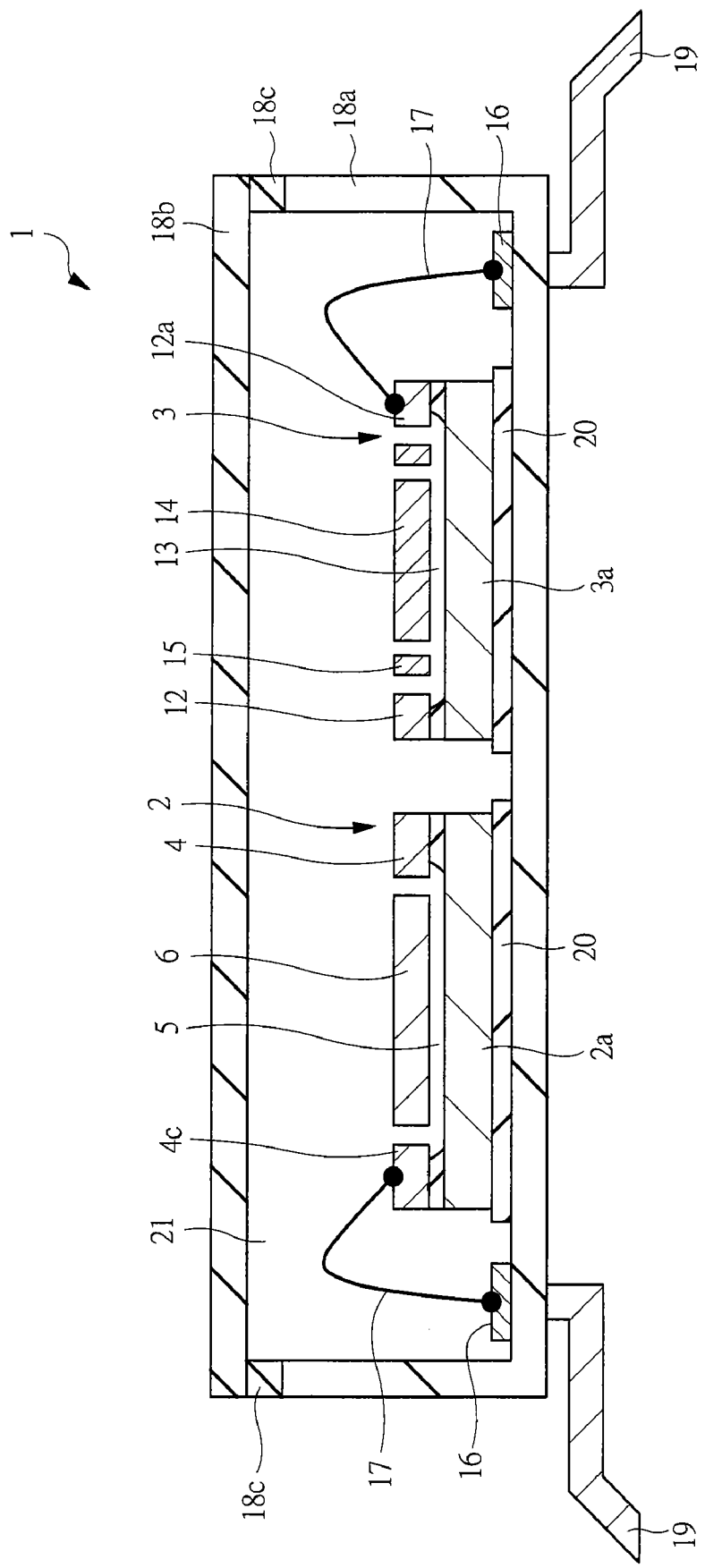
FIG. 2 is a schematic cross-sectional view cut along the A-A line in FIG. 1.

FIG. 2 is a schematic cross-sectional view showing a cross section cut along the line A-A of FIG. 1. As shown in FIG. 2, the angular rate sensor 2 and the acceleration sensor 3 are arranged in the interior of a package main body 18a. The package main body 18a has provided therein a lid 18b by an adhesion portion 18c, and is configured such that an interior space 21 can be airtightly sealed. This interior space 21 is in a state where the pressure is reduced below the atmospheric pressure. Consequently, the angular rate sensor 2 and the acceleration sensor 3 are disposed in the interior space 21 reduced in pressure below the atmospheric pressure. From this, the angular rate sensor 2 can be airtightly sealed in a reduced pressure state, and the influence of the damping given to the vibrating body 6 can be reduced, and thus the detection sensitivity of the angular rate can be improved.

As shown in FIG. 2, the angular rate sensor 2 is formed on a semiconductor substrate 2a, and the acceleration sensor 3 is formed on a semiconductor substrate 3a disposed on the package main body 18a interposing an adhesive agent 20. Even when this angular rate sensor 2 and the acceleration sensor 3 are in an airtightly sealed state in the interior space 21 of the package, the input and output signals of the angular rate sensor 2 and the acceleration sensor 3 are connected to the terminal 16 by electrically connecting the angular sensor 2 and the acceleration sensor 3 to the terminal 16 of the interior of the package by the wire 17 and the like. Since the terminal 16 is connected to a lead 19 provided outside of the package main body 18a, the input and output signals of the angular rate sensor 2 and the acceleration sensor 3 can be retrieved from the lead 19 formed outside of the package main body 18a through the wire 17 and the terminal 16.

As described above, when the angular rate sensor 2 is airtightly sealed in a state having the pressure reduced below the atmospheric pressure, the detection sensitivity of the angular rate sensor 2 can be improved. However, as shown in FIG. 2, when not only the angular rate sensor 2, but also the acceleration sensor 3 is disposed in a reduced pressure state, a movable body 14 of the acceleration sensor 3 is put into a state very prone to vibrate. When acceleration is not applied to the acceleration sensor 3, the movable body 14 of the acceleration sensor 3 is preferably in a stand-still state. However, when the movable body 14 of the acceleration sensor 3 is disposed in a reduced pressure state, it is sensibly displaced, and therefore, even in a state in which the acceleration is not applied, the movable body 14 ends up being displaced. This means that a noise component is generated in the acceleration detection by the acceleration sensor 3, and it lowers the detection sensitivity of the acceleration sensor 3. That is, the movable body 14 of the acceleration sensor 3 preferably does not react much sensibly in view of improving the detection sensitivity of the acceleration sensor 3.

From this, it is considered that the vibrating body 6 of the angular rate sensor 2 and the movable body 14 of the acceleration sensor 3 are disposed in a different atmospheric pressure space, respectively. That is, the vibrating body 6 of the angular rate sensor 2 is disposed in the space portion airtightly sealed in a reduced pressure state, and the movable body 14 of the acceleration sensor 3 is disposed in the space portion airtightly sealed in the atmospheric pressure. With this configuration, the vibrating body 6 of the angular rate sensor 2 is not affected due to the damping by air, and can vibrate in high frequency and large amplitude, so that the detection sensitivity of the angular rate sensor 2 can be improved. On the other hand, since the movable body 14 of the acceleration sensor 3 is put under the atmospheric pressure, it receives the effect of the damping due to air, and therefore, sensitive displacement more than necessary can be suppressed, and as a result, the detection sensitivity of the acceleration sensor can be improved.

However, in order to improve the detection sensitivity of the angular rate sensor 2 and the detection sensitivity of the acceleration sensor 3, when sealing pressures inside the disposing space of the angular rate sensor 2 and the disposing space of the acceleration sensor 3 are made different, the problem as shown below arise. That is, when sealing pressures inside the disposing space of the angular rate sensor 2 and the disposing space of the acceleration sensor 3 are made different, since the pressure management of two different specifications is performed inside the substrate (semiconductor chip), it is necessary to introduce an airtight sealing technique and a getter material eliminating an unnecessary gas molecule into a manufacturing process. This has negative effects of bringing about a high manufacturing cost. Further, since the pressure management of two different specifications is performed inside the substrate, there arises a problem that it is difficult to maintain reliability with respect to temporal change.

Consequently, it turns out that the sealing pressure of the angular rate sensor 2 and the sealing pressure of the acceleration sensor 3 are preferably made the same. Hence, in the first embodiment, there is provided a technique capable of suppressing the lowering of the detection sensitivity of the acceleration sensor 3 in which the sealing pressure of the angular rate sensor 2 and the sealing pressure of the acceleration sensor 3 are made the same, and also, the detection sensitivity of the angular rate sensor 2 can be improved even when the sealing pressure is configured to be reduced below the atmospheric pressure.

In the following, as shown in FIG. 2, there will be described the configuration of the acceleration sensor 3, which is capable of suppressing the lowering of the detection sensitivity of the acceleration sensor 3 even when the angular rate sensor 2 and the acceleration sensor 3 are airtightly sealed in the same reduced pressure state.

Figure 3:
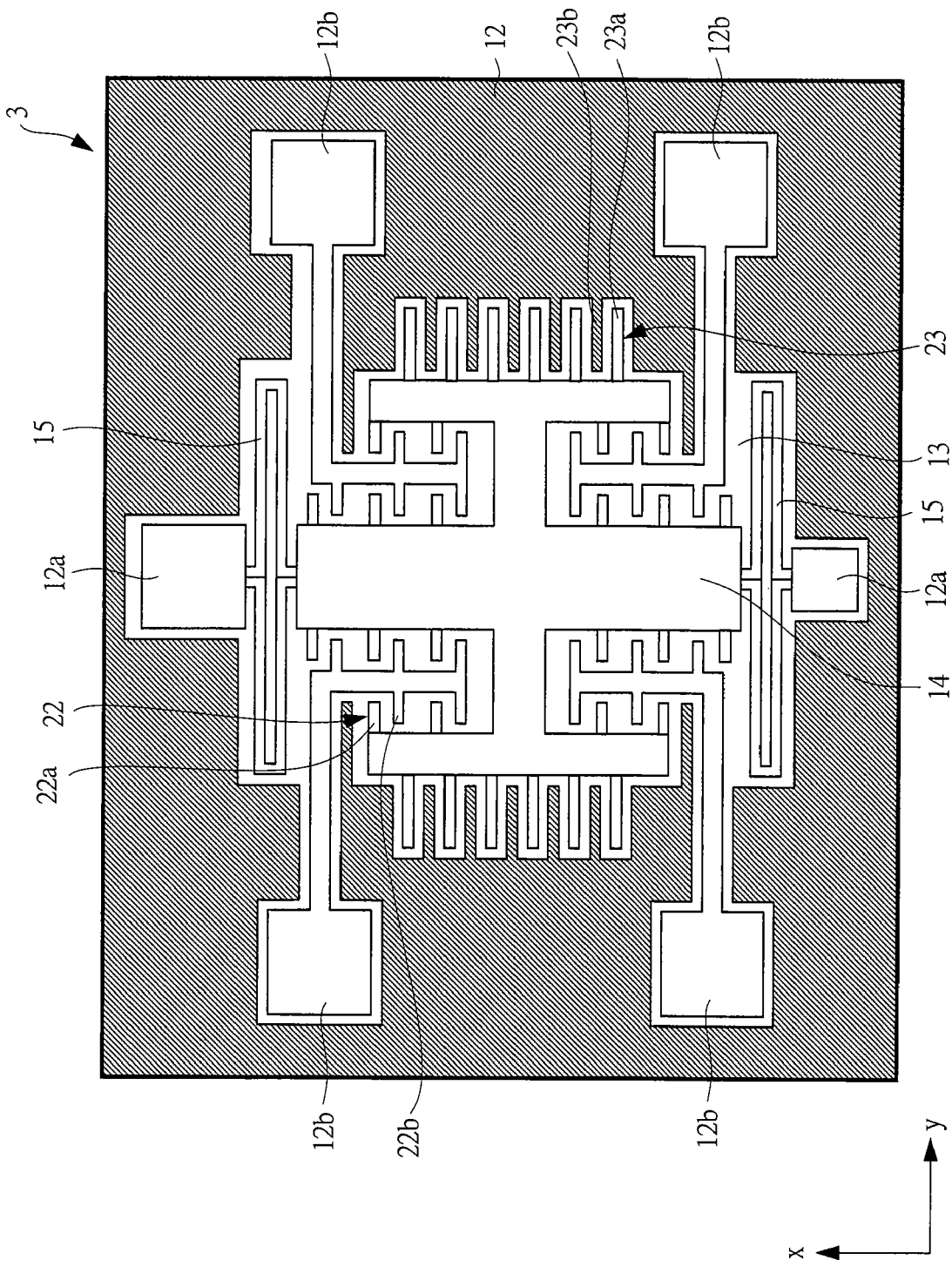
FIG. 3 is a plan view showing a configuration of an acceleration sensor according to the first embodiment.

FIG. 3 is a plan view showing the acceleration sensor 3 in the first embodiment. As shown in FIG. 3, the acceleration sensor 3 in the first embodiment is formed with the cavity portion 13 in the interior of the peripheral portion 12 in a rectangular shape. In the interior of this cavity portion 13, the fixing portions 12a and 12b, and the movable body 14 are formed. The fixing portions 12a and 12b are parts fixed to the semiconductor substrate (semiconductor chip), and are unable to displace. On the other hand, the movable body 14 is connected to the fixing portion 12a via the elastic deformation portion 15 which is elastically deformable. Since the elastic deforming portion 15 is configured to be elastically deformable in the x direction of FIG. 3, the movable body 14 can move (be displaced) in the x direction. Particularly, the movable body 14 is configured to be displaced upon receipt of an acceleration in the x direction. That is, the acceleration sensor 3 in the first embodiment can be said to be an acceleration sensor for detecting the acceleration applied in the x direction.

The movable body 14 is formed with a detecting portion 22. The detecting portion 22 is configured by a detecting electrode 22a integrally provided with the movable body 14 and a fixed electrode 22b connected to the fixing portion 12b which is isolated from the movable body 14. In this manner, the detecting portion 22 is formed as a capacitor element comprised of the detecting electrode 22a and the fixed electrode 22b, in which the distance between the detecting electrode 22a and the fixed electrode 22b is changed by the shift of the movable body 14 so that the capacitance change is detected based on this change of the distance between the detecting electrode 22a ad the fixed electrode 22b. This detecting portion 22 is formed as the plurality of detecting electrodes 22a and the plurality of fixed electrodes 22b are alternately arranged having spacing to each other, and the plurality of detecting electrodes 22a and the plurality of fixed electrodes 22b are arranged in a so-called comb-like shape.

Next, a characteristic configuration of the acceleration sensor 3 in the first embodiment will be described. One of the characteristics of the acceleration sensor 3 in the first embodiment is that the acceleration sensor 3 is provided with a shift suppressing portion (damper) 23 for suppressing shifts of the movable body 14. That is, since the acceleration sensor 3 in the first embodiment is airtightly sealed in a reduced pressure state below atmospheric pressure, the movable body 14 is in a state very easy to move. Hence, in the first embodiment, to suppress the shift (displacement) of the movable body 14, the shift suppressing portion 23 is provided. Therefore, the movable body 14 can be prevented from moving (being displaced) in a state where an acceleration is not applied to the acceleration sensor 3. That is, in a state where the acceleration is not applied from the outside of the acceleration sensor 3, the movable body 14 of the acceleration sensor 3 is preferably always standing still, but in the reduced pressure atmosphere, the movable body 14 is in a state very easy to vibrate. In this manner, even in a state where the acceleration to be detected is not applied, when the movable body 14 is vibrated, it is unable to correctly detect the acceleration. In other words, the detection sensitivity of the acceleration sensor 3 is lowered. Hence, by providing the acceleration sensor 3 with the shift suppressing portion 23 for suppressing the shift of the movable body 14, a state in which the movable body 14 is hard to vibrate even in a reduced-pressure atmosphere is realized by using the effect of viscous resistance of air possessed by the shift suppressing portion 23. As a result, even when airtightly sealed with the gas of the same kind and the same pressure as the angular rate sensor 2, the acceleration sensor 3 with high detection sensitivity can be obtained.

The shift suppressing portion 23 here is not a stopper for forcibly preventing shifts of the movable body 14 from exceeding a certain value, but is a component having a function of alleviating a sensitive reaction to the external environment. In other words, the shift suppressing portion 23 can be said to be a component having a function of delaying (blunting) a response to acceleration as compared with the case where the shift suppressing portion 23 is not provided. According to this shift suppressing portion 23, since the response to acceleration can be delayed, even when an acceleration is not applied in the reduced-pressure atmosphere, the movable body 14 can maintain a stand-still state without wobbling. Consequently, unnecessary displacements of the movable body 14 can be eliminated, thereby enabling the detection sensitivity of the acceleration sensor 3 to be improved.

Subsequently, the configuration of the shift suppressing portion 23 will be described. As shown in FIG. 3, the shift suppressing portion 23 is configured by a plurality of protruding portions 23a provided in the movable body 14 and a plurality of protruding portions 23b provided in the peripheral portion 12. The plurality of protruding portions 23a integrally formed with this movable body 14 and the plurality of protruding portions 23b integrally formed with the peripheral portion 12 are alternately arranged separately. At this time, a space exists between the protruding portion 23a and the protruding portion 23b alternately arranged separately, and this space is filled with a sealing gas (for example, air) and the like. In this state, when the movable body 14 is about to move, the protruding portion 23a integrally formed with the movable body 14 also gets to move to the protruding portion 23b fixed to the peripheral portion 12. However, the air existing between the protruding portion 23a and the protruding portion 23b functions to hinder the displacement of the protruding portion 23a by the effect of viscous resistance of air. Hence, by providing the shift suppressing portion 23 configured by the protruding portion 23a and the protruding portion 23b, the movable body 14 formed with the protruding portion 23a is hard to move. Thereby, it turns out that the shift suppressing portion 23 configured by the protruding portion 23a and the protruding portion 23b functions as a damper. Here, while the shift suppressing portion 23 is described as being configured by the protruding portion 23a and the protruding portion 23b, these protruding portions 23a and 23b are termed as such in order to emphasize that they are protruded from the movable body 14 or the peripheral portion 12. Actually, they are parallel plate-shaped. In view of suppressing the shifts of the movable body 14, providing the plurality of protruding portions 23a and 23b can increase the effect.

Further, the effect of viscous resistance of air by the air existing between the protruding portion 23a and the protruding portion 23b becomes large as the distance between the protruding portion 23a and the protruding portion 23b is narrowed down. Consequently, in view of realizing the shift suppression of the movable body 14 by the shift suppressing portion 23, the narrower the distance between the protruding portion 23a and the protruding portion 23b is, the more preferable it becomes. Hence, for example, the distance between the protruding portion 23a and the protruding portion 23b is preferably narrowed down until it becomes a minimum feature size at the time of forming an inertial sensor. Specifically, since the minimum feature size of the inertial sensor is about 1 µm to 3 µm, the distance between the protruding portion 23a and the protruding portion 23b is set to about 1 µm to 3 µm, so that the effect of viscous resistance of air by the sealing air can be particularly enhanced. Further, the distances from the protruding portion 23a to the protruding portions 23b disposed at both sides thereof are preferably narrowed down until both of them become the minimum feature size. That is, by alternately arranging the protruding portions 23a and the protruding portions 23b separately at equal intervals, the effect of viscous resistance of air can be improved.

Here, the shift suppressing portion 23 is required to suppress the movements in the x direction which is the shift direction of the movable body 14. With this configuration, the shift suppressing portion 23 can suppress the displacements in the x direction which is the shift direction of the movable body 14.

In the first embodiment, as the gas for airtightly sealing the angular rate sensor 2 and the acceleration sensor 3, air is described as an example. However, the gas used for the airtight sealing is not limited to air, but may be configured also by a rare gas, a nitrogen gas, a mixed gas of these gasses and the like. In particular, in view of improving viscous resistance effect, the gas having high viscous resistance is preferably used.

The acceleration sensor 3 in the first embodiment is thus configured, and the operation thereof will be described below. First, a description will be made on the case where the acceleration is not applied to the acceleration sensor 3. In this case, in FIG. 3, while the movable body 14 is not displaced, since the acceleration sensor 3 is placed in the reduced-pressure atmosphere, the movable body 14 has a possibility of wobbling from a stand-still state. However, in the first embodiment, since the movable body 14 is provided with the shift suppressing portion 23, the shift of the movable body 14 is suppressed by the effect of viscous resistance of the gas existing between the protruding portion 23a and the protruding portion 23b configuring the shift suppressing portion 23, thereby always maintaining a stand-still state. Hence, the distance between the detecting electrode 22a and the fixed electrode 22b does not change, and as a result, the capacitance of the capacitor element configured by the detecting electrode 22a and the fixed electrode 22b does not change. Consequently, the acceleration sensor 3 can be determined to be in a state not applied with the acceleration. That is, when the shift suppressing portion 23 which is one of the characteristics of the first embodiment is not provided, there is a possibility that, in a reduced pressure state, the movable body 14 is displaced even in a state not applied with the acceleration, and the acceleration sensor 3 is erroneously determined to be applied with the acceleration. However, according to the first embodiment, even in the reduced pressure state, the shift suppressing portion 23 for suppressing the shift of the movable body 14 is provided, and therefore, when the acceleration is not applied, it is possible to suppress the erroneous determination that the acceleration is applied. Consequently, according to the acceleration sensor 3 in the first embodiment, the detection sensitivity of the acceleration can be improved.

Subsequently, the case where the acceleration sensor 3 is applied with the acceleration will be described. When the acceleration sensor 3 is applied with the acceleration in the x direction, the movable body 14 of the acceleration sensor 3 is displaced in the x direction just by an amount corresponding to rigidity of the elastic deforming portion 15 according to the law of inertia. As a result, the distance between the detecting electrode 22a integrally formed with the movable body 14 and the fixed electrode 22b fixed to the fixing portion 12b is changed. When the distance between the detecting electrode 22a and the fixed electrode 22b is changed, the electrostatic capacitance value of the capacitor element configured by the detecting electrode 22a and the fixed electrode 22b is changed, and by electrically measuring this amount of change, the moving distance of the movable body 14 is calculated, and from the moving distance of the movable body 14, the applied acceleration is calculated. In this manner, the acceleration in the x direction can be detected by the acceleration sensor 3.

According to the first embodiment, even when the configuration is such that the sealing pressure of the angular rate sensor 2 and the sealing pressure of the acceleration sensor 3 are made the same, and moreover, the sealing pressure is reduced below the atmospheric pressure so that the detection sensitivity of the angular rate sensor 2 is improved, the lowering of the detection sensitivity of the acceleration sensor 3 can be suppressed. That is, when the sealing pressures inside the configuration space of the angular rate sensor 2 and the configuration space of the acceleration sensor 3 are made different as a method of improving both the detection sensitivity of the angular rate sensor 2 and the detection sensitivity of the acceleration sensor 3, to perform the pressure management of two different specifications inside the substrate (semiconductor chip), it is necessary to introduce the airtight sealing technique and a getter material for eliminating the unnecessary gas molecular into the manufacturing process, and this makes the manufacturing cost expensive. Further, to perform the pressure management of two different specifications inside the substrate, it is difficult to maintain reliability for temporal change.

On the contrary, in the first embodiment, the sealing pressure of the angular rate sensor 2 and the sealing pressure of the acceleration sensor 3 are made the same, and moreover, the sealing pressure is configured to be reduced below the atmospheric pressure so that the detection sensitivity of the angular rate sensor 2 is improved. The acceleration sensor 3 is provided with the shift suppressing portion 23. Hence, both of the detection sensitivity of the angular rate sensor 2 and the detection sensitivity of the acceleration sensor 3 can be improved. In addition, since there is no need to make the sealing pressures inside the disposing space of the angular rate sensor 2 and the disposing space of the acceleration sensor 3 different, remarkable advantages are obtained so that there is no need to manage the increase in production cost and different sealing pressures.

Next, a description will be made on the case where the configuration of the shift suppressing portion 23 provided in the acceleration sensor 3 and the configuration of the detecting portion 22 provided in the acceleration sensor 3 are different. As shown in FIG. 3, the detecting portion 22 has the detecting electrode 22a and the fixed electrode 22b alternately arranged separately, whereas the shift suppressing portion 23 has the protruding portion 23a and the protruding portion 23b alternately arranged separately, and therefore, the detecting portion 22 and the shift suppressing portion 23 can be considered to have the similar configuration. However, the detecting portion 22 and the shift suppressing portion 23 are components fundamentally different, and a description will be made on the fact that the shift suppression effect of the movable body 14 by the shift suppressing portion 23 is different from the detecting portion 22 to be significant.

The effect of viscous resistance of air in the MEMS device can be formulated by expanding the Navier-Stokes equation and the continuity equation which are the classic analytic approach of continuous fluid. When the parallel plate-shaped detecting electrode (protruding portion) is used, a squeeze damping term "Csq" which becomes a main cause of the effect of viscous resistance of air is expressed as follows.

$$Csq = 96\eta_{eff} lw^3/\pi^4 g^3 \quad (1)$$

$$\eta_{eff} = \eta/(l+9.638 K_n^{1.159}) \quad (2)$$

$$K_n = \lambda/L = k_B T/\sqrt{2}\pi d_{gas}^2 PL \quad (3)$$

Note that, "l" denotes a length of the detecting electrode, "w" denotes a width of the detecting electrode, "g" denotes a distance (gap) between detecting electrodes, "$\eta_{eff}$" denotes an actual value of the viscosity of the peripheral gas, "$\eta$" denotes a viscosity constant of the peripheral gas, "$K_n$" denotes a Knudsen number, "$\lambda$" denotes a mean free path of the peripheral gas, "L" denotes a characteristic length of a flow field and a length equivalent to the distance between the detecting electrodes, "$K_B$" denotes the Boltzmann's constant, "T" denotes an absolute temperature, "$d_{gas}$" denotes a diameter of the molecule of the peripheral gas, and "P" denotes a pressure of the peripheral gas.

A dominant factor of the effect of viscous resistance of air which is adjustable by design is a distance (gap) g between the detecting electrodes (protruding portions) based on the formulae (1) to (3), and has the following relationship.

$$Csq \propto 1/g^3 \quad (4)$$

Figure 4A:
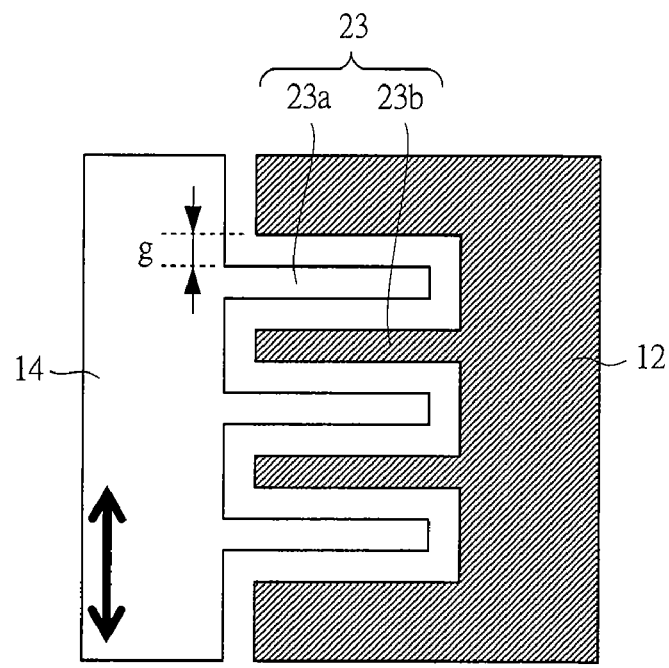
FIG. 4A is a diagram showing a detailed configuration of a shift suppressing portion.

That is, the shift suppressing portion (damper) 23 using the effect of viscous resistance of air can obtain the effect to the maximum extent when spatially most closely disposed, and when the minimum feature size is g, the shift suppressing portion is configured as shown in FIG. 4A. That is, FIG. 4A is a diagram showing the case where the distance between the protruding portion 23a and the protruding portion 23b configuring the shift suppressing portion 23 is g (the minimum feature size), and showing a state in which the protruding portion 23a and the protruding portion 23b are alternately disposed separately at equal intervals.

Figure 4B:
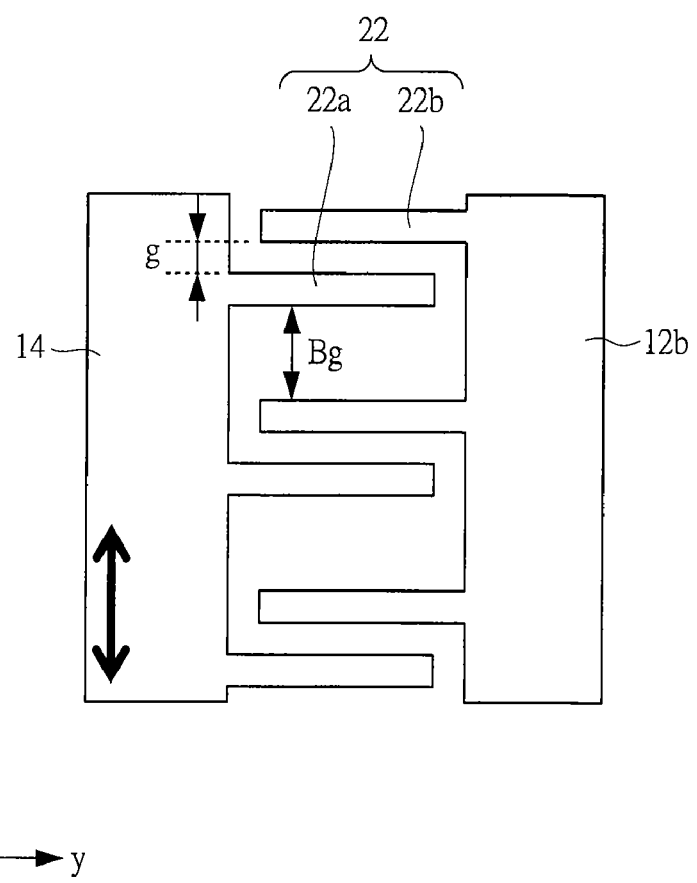
FIG. 4B is a diagram showing a detailed configuration of a detecting portion.

On the other hand, FIG. 4B shows the detecting electrode 22a and the fixed electrode 22b configuring the detecting portion 22, and shows the case where the distance between the detecting electrode 22a and one fixed electrode 22b is g (the minimum feature size), and the case where the distance between the detecting electrode 22a and the other fixed electrode 22b is Bg (g multiplied by B).

Strictly speaking, the detecting portion 22 (see FIG. 4B) also has a similar configuration as the shift suppressing portion 23 shown in FIG. 4A, and is considered to have the effect of suppressing the movable body 14 from moving in the movable direction (the x direction). However, since the acceleration sensor 3 has to correspond to either of the positive or the negative direction of acceleration vector, it is common that the parallel plate-shaped detecting portion 22 is not configured to have the detecting electrode 22a and the fixed electrode 22b alternately arranged at equal intervals but is configured to have them shifted from equal intervals as shown in FIG. 4B. That is, when the detecting electrode 22a and the fixed electrode 22b configuring the detecting portion 22 are alternately disposed separately, it is not possible to distinguish the case where the direction of the acceleration is reverse and the magnitude of the acceleration is the same. For example, in the case where the detecting electrode 22a and the fixed electrode 22b configuring the detecting portion 22 are alternately disposed at equal intervals, when an acceleration in a certain direction is applied, the change obtained by adding a change $\Delta C1$ of capacitance by the narrowing down of the intervals at one side and a change $\Delta C2$ of capacitance by the widening of the intervals at the other side is observed as a capacitance change. On the other hand, when the acceleration of the same magnitude is applied to the opposite side of the certain direction and, while the change obtained by adding the change $\Delta C1$ of capacitance by the narrowing down of the intervals at the other side and the change $\Delta C2$ of capacitance by the widening of the intervals at one side is observed as the capacitance change, this is the capacitance change similar to the case where the acceleration in one direction is applied. Consequently, when the detecting electrode 22a and the fixed electrode 22b configuring the detecting portion 22 are alternately arranged at equal intervals, it turns out that it is not possible to distinguish the cases where the directions of the acceleration are opposite and the magnitude of the accelerations is the same. Hence, in the detecting portion 22, while the detecting electrode 22a and the fixed electrode 22b are alternately arranged, they are arranged such that the distances from the detecting electrode 22a to the fixed electrodes 22b disposed at both sides of the detecting electrode 22a are made to be different. By disposing them asymmetrically in this manner, when the directions of the acceleration are opposite and the magnitude of the accelerations is the same, the change obtained by adding the change of the capacitance by the narrowing down of the intervals and the change of the capacitance by the widening of the intervals is made different and can be distinguished.

In this manner, the shift suppressing portion 23 in the first embodiment is configured to have the protruding portion 23a and the protruding portion 23b alternately disposed separately at equal intervals (g), on the contrary, the detecting portion 22 is differently configured to have the detecting electrode 22a and the fixed electrode 22b shifted from equal intervals. According to this difference, the effect of viscous resistance of air is made remarkably different.

A ratio of the effect of viscous resistance of air by the shift suppressing portion 23 and the effect of viscous resistance of air by the detecting portion 22 is as follows.

$$Csq(\text{shift suppressing portion 23})/Csq(\text{detecting portion 22})=2B^3/(B^3+1) \qquad (5)$$

And, when an interval ratio between the detecting electrode 22a and the fixed electrode 22b is B=3, the shift suppressing portion 23 can obtain a 1.9 times larger effect of viscous resistance of air than the detecting portion 22 per one pair of electrodes. Further, when the effect of viscous resistance of air obtained in the case where the minimum feature size and an electrode width are presumed to be at the same level is converted per unit area, the result is as follows.

$$Csq(\text{shift suppressing portion 23})/\text{Occupied area}(\text{shift suppressing portion 23})/Csq(\text{detecting portion 22})/\text{Occupied area}(\text{detecting portion 22})=2B^3/(B^3+1)\times(B+4)/5 \qquad (6)$$

And, when an interval ratio between the detecting electrode 22a and the fixed electrode 22b is B=3, the shift suppressing portion 23 can obtain a 2.7 times larger effect of viscous resistance of air than the detecting portion 22 per one pair of electrodes. Consequently, the shift suppressing portion 23 and the detecting portion 22 in the first embodiment are fundamentally different, and by adopting the configuration of the shift suppressing portion 23, the effect of viscous resistance of air far larger than the detecting portion 22 can be obtained.

Second Embodiment

While descriptions have been made on the example in which the angular rate sensor and the acceleration sensor are formed in separate semiconductor substrates (semiconductor chips) in the first embodiment, in the second embodiment, descriptions will be made on an example in which the angular rate sensor and the acceleration sensor are formed in the same semiconductor substrate (semiconductor chip).

Figure 5:
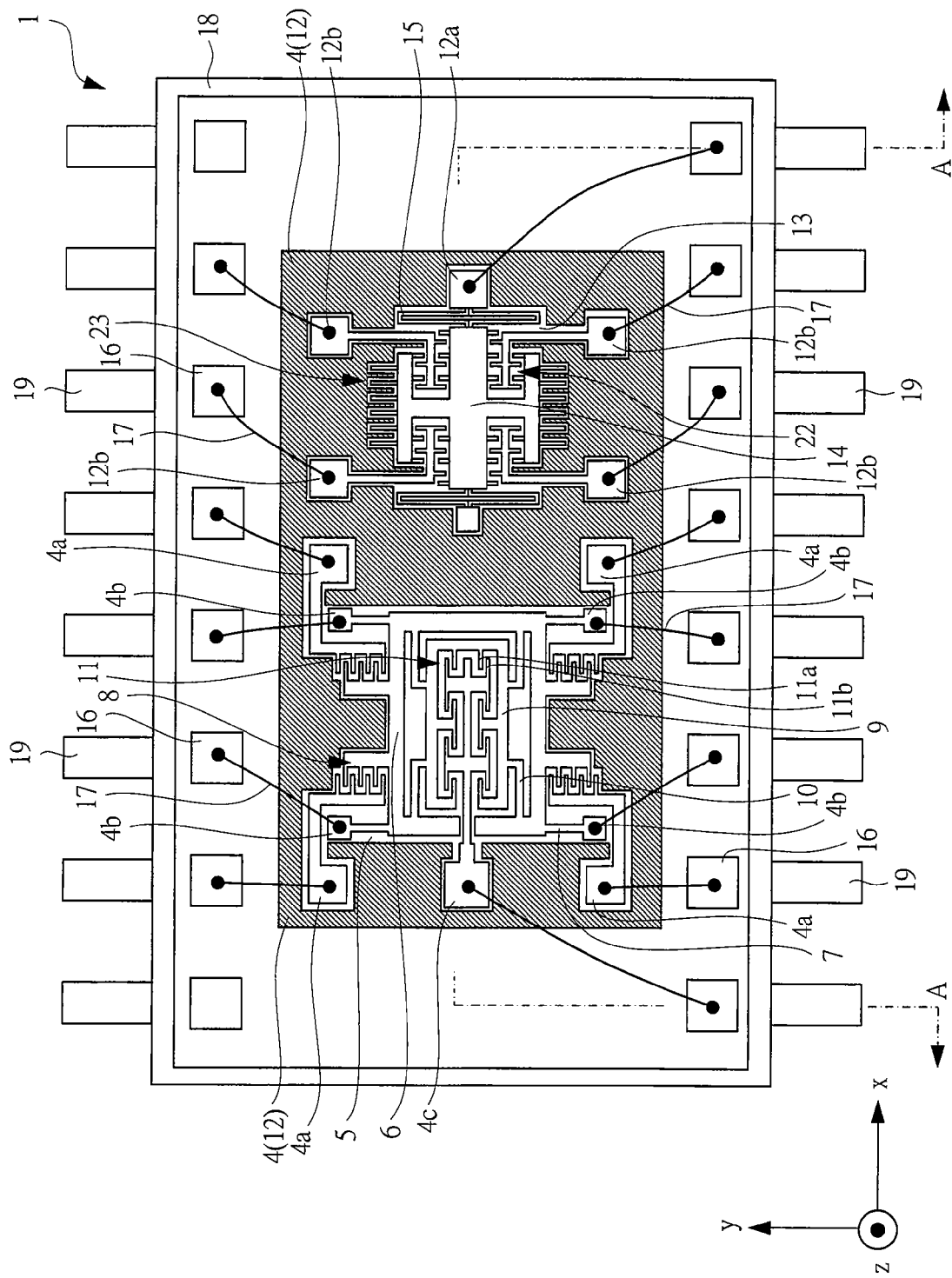
FIG. 5 is a plan view showing a configuration of an inertial sensor according to a second embodiment of the present invention.

FIG. 5 is a plan view showing an inertial sensor 1 in the second embodiment. As shown in FIG. 5, the packaging method of the inertial sensor 1, the internal gas pressure, the configuration and the effect of the shift suppressing portion (damper) 23 are the same as the already described case where the acceleration sensor and the angular rate sensor are formed on the separate semiconductor substrates. A difference lies in the point that the angular rate sensor and the acceleration sensor are formed on the same semiconductor substrate. That is, since the angular rate sensor and the acceleration sensor are airtightly sealed by the same pressure reduced below the atmospheric pressure in the present invention, there is no need to form the angular rate sensor and the acceleration sensor on separate semiconductor substrates, but they are formed on the same semiconductor substrate.

Figure 6:
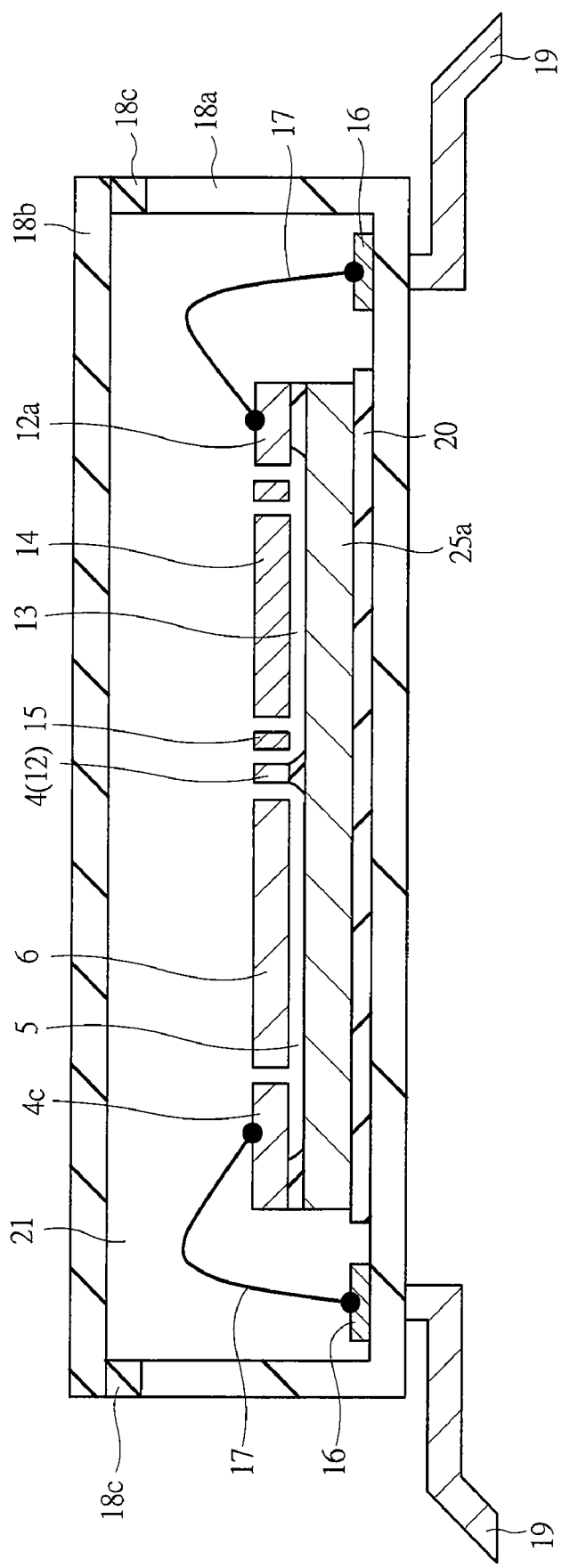
FIG. 6 is a schematic cross-sectional view cut along the A-A line in FIG. 5.

FIG. 6 is a cross-sectional view schematically showing a cross section cut along the line A-A of FIG. 5. As shown in FIG. 6, a semiconductor substrate 25a is disposed in the interior of the package main body 18a. This semiconductor substrate 25a is formed with the angular rate sensor and the acceleration sensor. The package main body 18a is adhered to the lid 18b by the adhesive portion 18c, so that the internal space 21 is airtightly sealed. This internal space 21 is airtightly sealed in a state having the pressure reduced below the atmospheric pressure. Thereby, the cavity portion in the angular rate sensor and the cavity portion in the acceleration sensor are sealed by one cap (lid 18b).

The second embodiment is also configured such that the sealing pressure of the angular rate sensor and the sealing pressure of the acceleration sensor are made the same, and the sealing pressure is reduced below the atmospheric pressure so that the detection sensitivity of the angular rate sensor is improved. As shown in FIG. 5, the acceleration sensor is provided with the shift suppressing portion 23. Hence, both of the detection sensitivity of the angular rate sensor and the detection sensitivity of the acceleration sensor can be improved. In addition, since there is no need to make the sealing pressures inside the configuration space of the angular rate sensor and the disposing space of the acceleration sensor different, remarkable advantages are obtained so that there is no need to manage the increase in production cost and different sealing pressures.

Particularly, in the second embodiment, the angular rate sensor and the acceleration sensor are integrated and manufactured on the same semiconductor substrate (one chip). Hence, in an assembly process of packaging the angular rate sensor and the acceleration sensor, an alignment process for an inertial axis between the angular rate sensor and the acceleration sensor is not required, and further, high-accuracy and low cost can be achieved as the inertial sensor. That is, in the inertial sensor provided with the angular rate sensor and the acceleration sensor, since an angular rate detection about a z direction by the angular rate sensor and an acceleration detection in the x direction by the acceleration sensor are performed at the same time, it is necessary to align x, y, and z directions of the angular rate sensor and x, y, and z directions of the acceleration sensor. Hence, in the case where the angular rate sensor and the acceleration sensor are formed by separate semiconductor substrates, when the angular rate sensor and the acceleration sensor are packaged, an alignment process is required to adjust the position of each semiconductor substrate arranged so that the x, y, and z directions of the angular rate sensor and the x, y, and z directions of the acceleration sensor are aligned. In contrast to this, similarly to the second embodiment, when the angular rate sensor and the acceleration sensor are formed in the same semiconductor substrate, since the x, y, and z directions of the angular rate sensor and the x, y, and z directions of the acceleration sensor are already aligned, no alignment process is required. Further, when the angular rate sensor and the acceleration sensor are formed in the same semiconductor substrate, the angular rate sensor and the acceleration sensor can be closely arranged, and therefore, the miniaturization of the inertial sensor can be achieved compared with the case where the angular rate sensor and the acceleration sensor are formed on separate semiconductor substrates.

Third Embodiment

Figure 7:
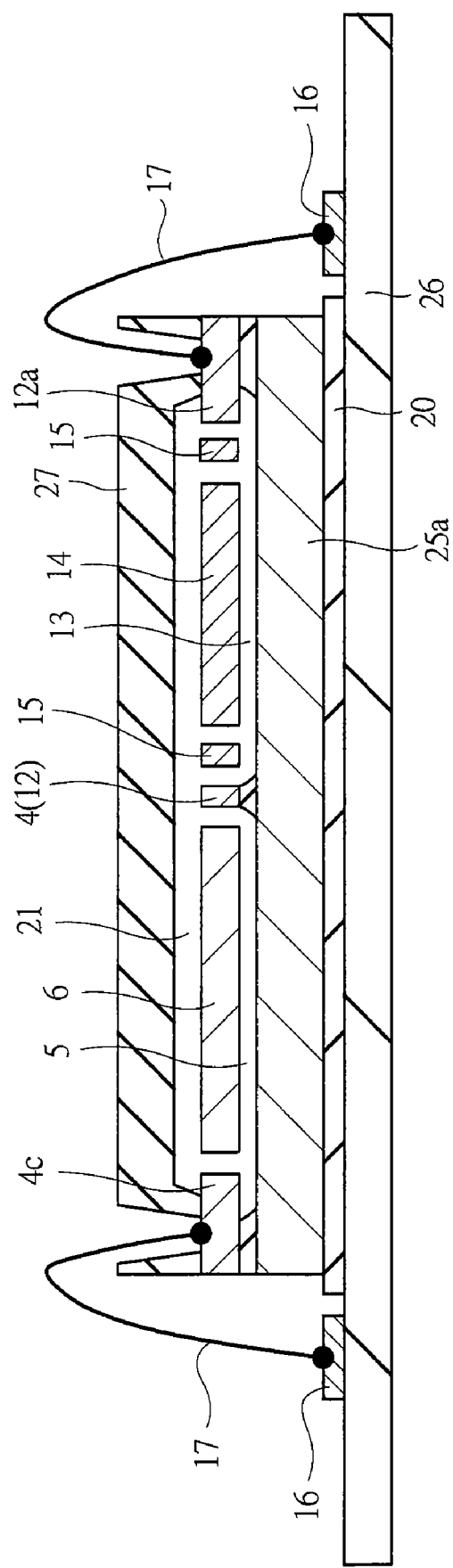
FIG. 7 is a schematic cross-sectional view showing a configuration of an inertial sensor according to a third embodiment.

For example, in an inertial sensor in which an acceleration sensor and an angular rate sensor are integrated on the same semiconductor substrate (one chip), the acceleration sensor and the angular rate sensor can be disposed inside a space of the same kind and having the same pressure. Hence, the inertial sensor can be managed easily by a wafer level package (WLP) as shown in FIG. 7. While the angular rate sensor and the acceleration sensor are formed in the individual chip areas formed in the semiconductor wafer, before singulating the chip area formed with the angular rate sensor and the acceleration sensor, a technique for sealing each chip area by a cap is referred to as a wafer level package. FIG. 7 is a schematic cross-sectional view showing a configuration of the inertial sensor subjected to wafer level packaging, and showing a state in which the angular rate sensor and the acceleration sensor formed on the same semiconductor substrate 25a are sealed by a cap 27, and the semiconductor substrate 25a is mounted on a wiring board 26. According to the wafer level package, before dicing the semiconductor wafer into individual chips, since each chip area is sealed by using the cap 27, it is possible to prevent foreign matters generated by dicing from intruding into the airtightly sealed interior space 21. Hence, an improvement of the reliability of the inertial sensor can be achieved. Further, according to the wafer level package, since the size of the package can be made substantially the same as the size of the semiconductor substrate 25a, a miniaturization of the inertial sensor can be also achieved.

To subject the inertial sensor making the sealing pressure of the angular rate sensor and the sealing pressure of the acceleration sensor different to wafer level packaging, it is necessary to separate the sealing space of the angular rate sensor and the sealing space of the acceleration sensor by a protruding portion provided in the member equivalent to the lid of the wafer level package, and to manage the sealing spaces of the acceleration sensor and the angular rate sensor by different pressures. That is, the sealing space (cavity) of the acceleration sensor is required to be depressurized, for example, to the atmospheric pressure, and the sealing space of the angular rate sensor is required to be depressurized, for example, to 1000 Pa, and so it is very difficult to adjust the pressures during the manufacturing process. Depending on the circumstances, it is necessary to selectively coat a getter material on the sealing space (cavity) of the angular rate sensor, which needs to be disposed in an atmosphere having a further reduced pressure. In contrast to this, in the third embodiment, by providing a shift suppressing portion (damper) in the acceleration sensor, both the acceleration sensor and the angular rate sensor can be disposed in the same sealing space depressurized, for example, to 1000 Pa. Hence, according to the third embodiment, the manufacturing process of performing the wafer level package can be simplified, and the inertial sensor having high reliability to temporal change of the pressure can be obtained.

Fourth Embodiment

Figure 8:
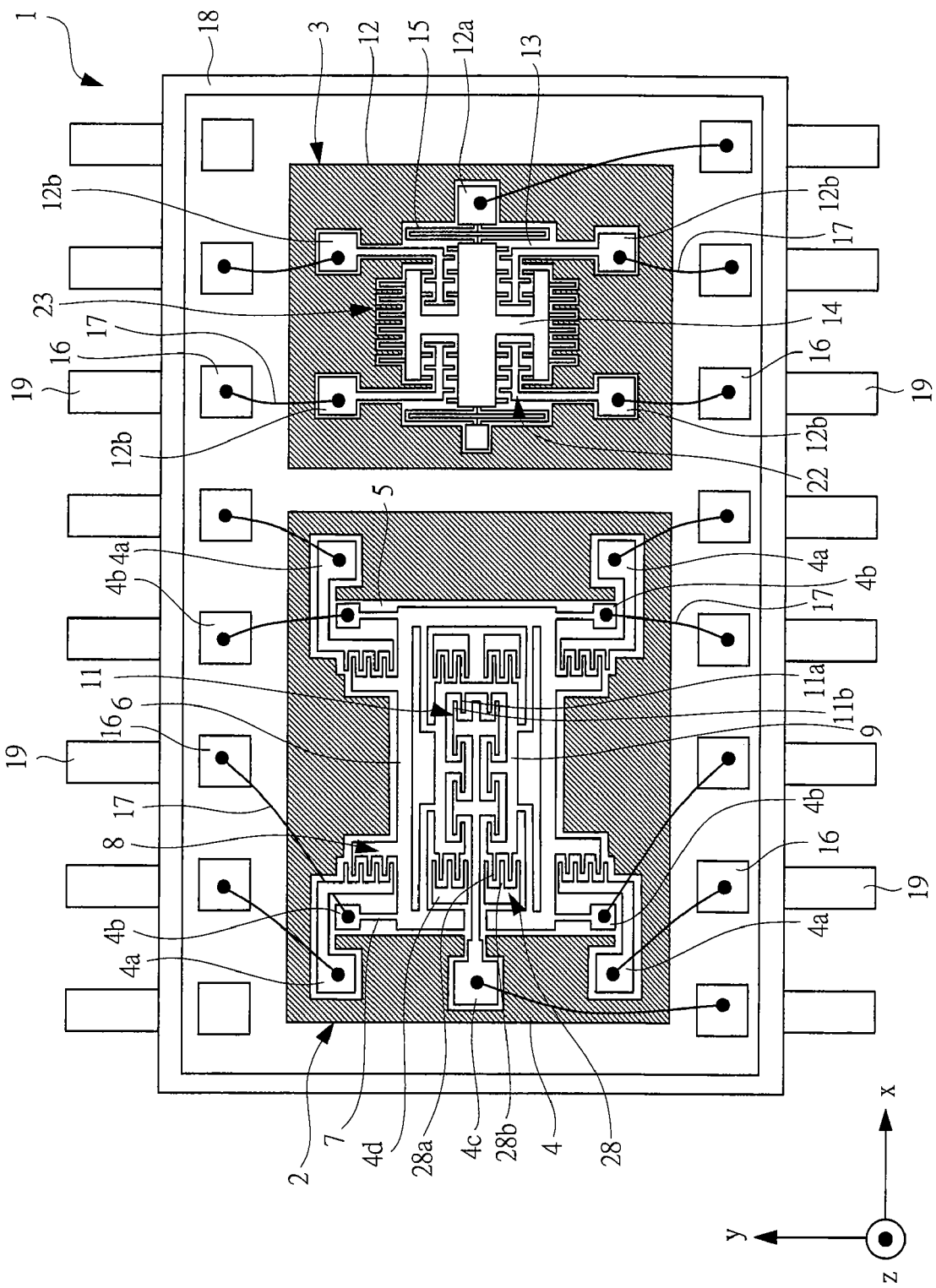
FIG. 8 is a plan view showing a configuration of an inertial sensor according to a fourth embodiment.

While the shift suppressing portion is provided only for the acceleration sensor in the first embodiment, in a fourth embodiment, descriptions will be made on an example in which the shift suppressing portion is provided to both of the angular rate sensor and the acceleration sensor. FIG. 8 is a plan view showing an inertial sensor according to the fourth embodiment. As shown in FIG. 8, this inertial sensor 1 is configured by the package 18, the angular rate sensor 2 disposed in the interior of the package 18, and the acceleration sensor 3. The package 18 is covered by a plate-like part formed by a metal member or a plastic member, and the interior of the package 18 at this time has a sealing space provided with the vibrating body 6 of the angular rate sensor 2 and the movable body 14 of the acceleration sensor 3 in a state capable of vibrating, and this sealing space has an atmosphere depressurized such that the vibrating body 6 of the angular rate sensor 2 can vibrate with an amplitude larger than a set value. At this time, the angular rate sensor 2 and the acceleration sensor 3 are airtightly sealed by gas of same kind and at same pressure. Further, the airtightness to the extent that the gas outside of the package 18 does not move into the interior of the package 18 is maintained over a period in which the inertial sensor 1 is supposed to make a stable output.

While the angular rate sensor 2 and the acceleration sensor 3 are sealed in the interior of the package 18 by the gas of the same kind and the pressure, one of the characteristics of the four embodiment is that the movable body 14 of the acceleration sensor 3 is provided with the shift suppressing portion (damper) 23 for suppressing the shift of the movable body 14, and the Coriolis frame 9 of the angular rate sensor 2 is also provided with a shift suppressing portion (damper) 28 for suppressing the shift of the Coriolis frame 9.

The reason why the movable body 14 of the acceleration sensor 3 is provided with the shift suppressing portion 23 is the same as the first embodiment. That is, in a state in which an acceleration is not applied from the outside of the acceleration sensor 3, the movable body 14 of the acceleration sensor 3 is preferably always in a stand-still state. However, in a reduced pressure atmosphere, the movable body 14 is in a state very prone to vibrate. In this manner, even in a state in which the acceleration to be detected is not applied, when the movable body 14 vibrates, it is unable to correctly detect the acceleration. In other words, the detection sensitivity of the acceleration sensor 3 is lowered. Hence, by providing the acceleration sensor 3 with the shift suppressing portion 23 for suppressing the shift of the movable body 14, a state in which the movable body 14 is hard to vibrate even in the reduced pressure atmosphere is realized by using the effect of viscous resistance of air possessed by the shift suppressing portion 23. As a result, the acceleration sensor 3 having a high detection sensitivity can be obtained even when it is airtightly sealed with the gas of the same kind and the same pressure as the angular rate sensor 2.

Further, in the fourth embodiment, the Coriolis frame 9 of the angular rate sensor 2 is also provided with the shift suppressing portion 28. The configuration of this shift suppressing portion 28 will be described. As shown in FIG. 8, the shift suppressing portion 28 is configured by a plurality of protruding portions (third protruding portions) 28a provided in the Coriolis frame 9 and a plurality of protruding portions (fourth protruding portions) 28b provided in a fixing portion (third fixing portion) 4d. The plurality of protruding portions 28a integrally formed with this Coriolis frame 9 and the plurality of protruding portions 28b integrally formed with the fixing portion 4d are alternately arranged separately. At this time, a space exists between the protruding portion 28a and the protruding portion 28b which are alternately arranged separately, and this space is filled with a sealing gas (for example, air) and the like. In this state, when the Coriolis frame 9 is about to move, the protruding portion 28a integrally formed with the Coriolis frame 9 also gets to move to the protruding portion 28b fixed to the fixing portion 4d. However, the air existing between the protruding portion 28a and the protruding portion 28b functions to hinder the displacement of the protruding portion 28a by the effect of viscous resistance of air. Hence, by providing the shift suppressing portion 28 configured by the protruding portion 28a and the protruding portion 28b, the Coriolis frame 9 formed with the protruding portion 28a becomes hard to move. Consequently, it turns out that the shift suppressing portion 28 configured by the protruding portion 28a and the protruding portion 28b functions as a damper.

Moreover, the effect of viscous resistance of air by the air existing between the protruding portion 28a and the protruding portion 28b becomes larger as the distance between the protruding portion 28a and the protruding portion 28b is made narrower. Consequently, in view of realizing the shift suppression of the Coriolis frame 9 by the shift suppressing portion 28, the narrower the distance between the protruding portion 28a and the protruding portion 28b is, the better it becomes. Hence, for example, the distance between the protruding portion 28a and the protruding portion 28b is preferably narrowed down until it becomes the minimum feature size at the time of forming the inertial sensor. The distances from the protruding portion 28a to the protruding portions 28b formed at both sides of the protruding portion 28a are preferably narrowed down until both of them become the minimum feature size. That is, by alternately disposing the protruding portions 28a and the protruding portions 28b separately at equal intervals, the effect of viscous resistance of air can be improved.

Here, the shift suppressing portion 28 is required to suppress the shifting in the y direction which is the shift direction of the Coriolis frame 9. Hence, the plurality of protruding portions 28a and the plurality of protruding portions 28b are configured to protrude in a direction to cross the y direction to which the Coriolis frame 9 shifts upon receipt of the Coriolis force, and the plurality of protruding portions 28a and the plurality of protruding portions 28b are configured in parallel in the y direction. By making such a configuration, the shift suppressing portion 28 can suppress the displacement in the y direction which is the shift direction of the Coriolis frame 9.

As described above, in the fourth embodiment, the Coriolis frame 9 of the angular rate sensor 2 is also provided with the shift suppressing portion 28, and this reason will be described. The angular rate sensor 2 has an axial direction (x direction) always desired to have a large vibration amplitude as a vibration gyro, and an axial direction (y direction) to which the Coriolis frame 9 shifts upon receipt of the Coriolis force when an angular rate is applied, and both the directions are orthogonal to each other. In a state in which an angular rate is not applied from the outside, while the Coriolis frame 9 shifting upon receipt of the Coriolis force preferably does not have a velocity component in the shift direction (y direction), in the reduced pressure atmosphere, the Coriolis frame 9 shifting upon receipt of the Coriolis force is in a state very prone to vibrate. Consequently, the vibration in the vibration axis (x direction) of the angular rate sensor 2 is easily transmitted to the Coriolis frame 9 which shifts upon receipt of the Coriolis force via the interior of the angular rate sensor 2. Hence, even in a state in which the angular rate to be detected is not applied, there is a possibility that the Coriolis frame 9 shifts upon receipt of the Coriolis force vibrates in the y direction, so that it is unable to output a correct angular rate signal. Therefore, by providing the Coriolis frame 9 shifting upon receipt of the Coriolis force with the shift suppressing portion (damper) 28, and by using the effect of viscous resistance of air possessed by the shift suppressing portion (damper) 28, even in the reduced pressure atmosphere, a state where the Coriolis frame 9 shifting upon receipt of the Coriolis force is hard to vibrate is realized. As a result, even when the angular rate sensor 2 and the acceleration sensor 3 are airtightly sealed by a gas of the same kind and at the same pressure (depressurized), the angular rate sensor having a high detection sensitivity can be obtained.

In the foregoing, the invention made by the inventors of the present invention has been concretely described based on the embodiments. However, it is needless to say that the present invention is not limited to the foregoing embodiments and various modifications and alterations can be made within the scope of the present invention.

While descriptions have been made on the example where the inertial mass bodies having the acceleration sensor and the angular rate sensor configured separately in the embodiments described above, the present invention is applicable to an inertial sensor having a one mass configuration sharing inertial mass bodies of an acceleration sensor and an angular rate sensor.

The present invention can be widely used for a manufacturing industry manufacturing an inertial sensor having an angular rate sensor and an acceleration sensor.

What is claimed is:
1. An inertial sensor comprising:
(a) an angular rate sensor which detects an angular rate; and
(b) an acceleration sensor which detects acceleration, wherein
the angular rate sensor includes:
(a1) a first peripheral portion formed on a first semiconductor substrate;
(a2) a first cavity portion formed in the interior of the first peripheral portion;
(a3) a first fixing portion formed in the interior of the first cavity portion;
(a4) a vibrating body formed in the interior of the first cavity portion;
(a5) a first elastic deforming portion which is elastically deformable and connects the first fixing portion and the vibrating body;
(a6) a Coriolis frame formed in the interior of the vibrating body; and
(a7) a second elastic deforming portion which is elastically deformable and connects the vibrating body and the Coriolis frame, wherein
the acceleration sensor includes:
(b1) a second peripheral portion formed on a second semiconductor substrate;
(b2) a second cavity portion formed in the interior of the second peripheral portion;
(b3) a second fixing portion formed in the interior of the second cavity portion;
(b4) a movable body formed in the interior of the second cavity portion;
(b5) a third elastic deforming portion which is elastically deformable and connects the second fixing portion and the movable body; and
(b6) an acceleration detection portion which detects acceleration applied to the acceleration sensor,
wherein the first cavity portion and the second cavity portion are at a same pressure,
wherein the acceleration sensor is provided with a first shift suppressing portion, which is separate from the acceleration detection portion and is constructed to provide a damping function for suppressing shifts of the movable body with respect to an acceleration,
wherein the angular rate sensor further includes an angular rate detecting portion that detects a Coriolis force caused by an angular rate applied to the angular rate sensor, and
wherein the angular rate sensor is provided with a second shift suppressing portion, which is separate from the angular rate detecting portion and is constructed to provide a damping function for suppressing shifts of the Coriolis frame with respect to the Coriolis force.
2. The inertial sensor according to claim 1, wherein the first cavity portion and the second cavity portion are sealed, and wherein the first cavity portion and the second cavity portion are set to a pressure below the atmospheric pressure.
3. The inertial sensor according to claim 1, wherein the first shift suppressing portion has a function of delaying a response to an acceleration as compared with the case where the first shift suppressing portion is not provided.
4. The inertial sensor according to claim 1, wherein the first shift suppressing portion includes:
(c1) a plurality of first protruding portions formed on the movable body; and
(c2) a plurality of second protruding portions formed on the second peripheral portion, wherein the plurality of first protruding portions and the plurality of second protruding portions are alternately arranged separately.

5. The inertial sensor according to claim 4, wherein the plurality of first protruding portions and the plurality of second protruding portions are alternately arranged separately at equal intervals.

6. The inertial sensor according to claim 4, wherein the plurality of first protruding portions and the plurality of second protruding portions are configured to protrude in a direction crossing a first shift direction in which the movable body shifts upon receipt of an acceleration, and wherein
the plurality of first protruding portions and the plurality of second protruding portions are arranged in parallel in the first shift direction.

7. The inertial sensor according to claim 1, wherein the second shift suppressing portion has a function of delaying a response to the Coriolis force as compared with the case where the second shift suppression portion is not provided.

8. The inertial sensor according to claim 1, wherein the second shift suppressing portion includes:
(d1) a plurality of third protruding portions formed on the Coriolis frame; and
(d2) a plurality of fourth protruding portions formed on a third fixing portion, and
the plurality of third protruding portions and the plurality of fourth protruding portions are alternately arranged separately.

9. The inertial sensor according to claim 8, wherein the plurality of third protruding portions and the plurality of fourth protruding portions are alternately arranged separately at equal intervals.

10. The inertial sensor according to claim 8, wherein the plurality of third protruding portions and the plurality of fourth protruding portions are configured to protrude in a direction crossing a second shift direction in which the Coriolis frame shifts upon receipt of the Coriolis force, and wherein
the plurality of third protruding portions and the plurality of fourth protruding portions are arranged in parallel in the second shift direction.

11. The inertial sensor according to claim 1, wherein the first semiconductor substrate and the second semiconductor substrate are the same semiconductor substrate, and the angular rate sensor and the acceleration sensor are formed on this same semiconductor substrate.

12. The inertial sensor according to claim 11, wherein the first cavity portion on the angular rate sensor and the second cavity portion on the acceleration sensor are sealed by one cap.

13. The inertial sensor according to claim 12, wherein the angular rate sensor and the acceleration sensor are formed on the individual chip area formed in a semiconductor wafer, and prior to individualizing the chip area forming the angular rate sensor and the acceleration sensor, the each chip area is sealed by the cap.

14. The inertial sensor according to claim 1, wherein the acceleration detection portion includes:
(e1) a fixed electrode formed on the second fixing portion; and
(e2) a detecting electrode formed on the movable body, and wherein
the acceleration of the acceleration sensor is detected by utilizing a change in a capacitance of a capacitor element configured by the fixed electrode and the detecting electrode made as: the movable body is shifted by adding an acceleration to the acceleration sensor; and a distance between the fixed electrode and the detecting electrode is changed by the movement of the movable body.

15. The inertial sensor according to claim 14, wherein the fixed electrode is arranged between a pair of the detecting electrodes such that a distance between the fixed electrode and one of the pair of the detecting electrodes differs from a distance between the fixed electrode and the other of the pair of the detecting electrodes.

16. The inertial sensor according to claim 1, wherein:
the first shift suppressing portion includes:
 (c1) a plurality of first protruding portions formed on the movable body; and
 (c2) a plurality of second protruding portions formed on the second peripheral portion,
 the plurality of first protruding portions and the plurality of second protruding portions being arranged alternately at equal intervals; and
the acceleration detection portion includes:
 (d1) a plurality of fixed electrodes formed on the second fixing portion; and
 (d2) a plurality of detecting electrodes formed on the movable body,
 the plurality of detecting electrodes and the plurality of fixed electrodes being arranged alternately with successive intervals therebetween being unequal.

17. The inertial sensor according to claim 1, wherein:
the angular rate sensor has a driving direction associated with vibration of the vibrating body,
the acceleration sensor has a displacement direction associated with shifting of the movable body, and
the driving direction and the displacement direction are parallel to each other.

* * * * *